United States Patent
Fu et al.

(10) Patent No.: US 11,462,520 B2
(45) Date of Patent: Oct. 4, 2022

(54) CHIP INTEGRATION MODULE, CHIP PACKAGE STRUCTURE, AND CHIP INTEGRATION METHOD

(71) Applicant: HUAWEI TECHNOLOGIES CO., LTD., Shenzhen (CN)

(72) Inventors: HuiLi Fu, Shenzhen (CN); Song Gao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 6 days.

(21) Appl. No.: 15/922,932

(22) Filed: Mar. 16, 2018

(65) Prior Publication Data
US 2018/0204825 A1    Jul. 19, 2018

Related U.S. Application Data

(63) Continuation of application No. 14/810,043, filed on Jul. 27, 2015, now abandoned.

(30) Foreign Application Priority Data

Jul. 29, 2014    (CN) .......................... 201410366385.3

(51) Int. Cl.
*H01L 25/16* (2006.01)
*H01G 2/06* (2006.01)
*H01L 23/00* (2006.01)

(52) U.S. Cl.
CPC ............. *H01L 25/16* (2013.01); *H01G 2/065* (2013.01); *H01L 24/13* (2013.01); *H01L 24/03* (2013.01);

(Continued)

(58) Field of Classification Search
CPC ......... H01G 2/065; H01L 25/16; H01L 24/13; H01L 2924/19104; H01L 2224/16227;
(Continued)

(56) References Cited

U.S. PATENT DOCUMENTS 5,514,912 A    5/1996    Ogashiwa
5,601,740 A    2/1997    Eldridge et al.
(Continued)

FOREIGN PATENT DOCUMENTS

CN    1726591 A    1/2006
CN    101079406 A    11/2007
(Continued)

*Primary Examiner* — Benjamin Tzu-Hung Liu
(74) *Attorney, Agent, or Firm* — Maier & Maier, PLLC

(57) ABSTRACT

The present invention provides a chip integration module, including a die, a passive device, and a connecting piece, where the die is provided with a die bonding portion, the passive device is provided with a passive device bonding portion, the die bonding portion of the die and the passive device bonding portion of the passive device are disposed opposite to each other, and the connecting piece is disposed between the die bonding portion and the passive device bonding portion and is connected to the die bonding portion and the passive device bonding portion. The chip integration module of the present invention achieves easy integration and has low costs. Moreover, a path connecting the die to the passive device becomes shorter, which can improve performance of the passive device. The present invention further discloses a chip package structure and a chip integration method.

11 Claims, 4 Drawing Sheets

(52) U.S. Cl.
CPC ............ H01L 24/05 (2013.01); H01L 24/11 (2013.01); H01L 24/16 (2013.01); H01L 24/81 (2013.01); H01L 2224/0345 (2013.01); H01L 2224/03452 (2013.01); H01L 2224/0401 (2013.01); H01L 2224/04042 (2013.01); H01L 2224/05557 (2013.01); H01L 2224/05571 (2013.01); H01L 2224/05624 (2013.01); H01L 2224/05647 (2013.01); H01L 2224/11 (2013.01); H01L 2224/1134 (2013.01); H01L 2224/13023 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/13166 (2013.01); H01L 2224/13611 (2013.01); H01L 2224/13644 (2013.01); H01L 2224/13647 (2013.01); H01L 2224/13655 (2013.01); H01L 2224/13664 (2013.01); H01L 2224/16227 (2013.01); H01L 2224/16268 (2013.01); H01L 2224/48091 (2013.01); H01L 2224/48227 (2013.01); H01L 2224/73204 (2013.01); H01L 2224/73207 (2013.01); H01L 2224/75744 (2013.01); H01L 2224/75745 (2013.01); H01L 2224/81191 (2013.01); H01L 2224/81193 (2013.01); H01L 2224/81203 (2013.01); H01L 2224/81205 (2013.01); H01L 2224/81801 (2013.01); H01L 2224/92125 (2013.01); H01L 2924/181 (2013.01); H01L 2924/19041 (2013.01); H01L 2924/19042 (2013.01); H01L 2924/19043 (2013.01); H01L 2924/19104 (2013.01)

(58) Field of Classification Search
CPC ........... H01L 24/03; H01L 2224/75744; H01L 2924/181; H01L 24/05; H01L 24/16; H01L 2224/0345; H01L 2224/03452; H01L 2224/0401; H01L 2224/04042; H01L 2224/05557; H01L 2224/05571; H01L 2224/05624; H01L 2224/05647; H01L 2224/48227; H01L 2224/73207; H01L 2224/75745; H01L 2224/81191; H01L 2224/92125; H01L 2224/11; H01L 2224/48091; H01L 2224/73204; H01L 24/81; H01L 24/11; H01L 2224/16268; H01L 2224/13144; H01L 2224/13139; H01L 2224/13147; H01L 2224/13155; H01L 2224/13124; H01L 2224/13166; H01L 2224/81203; H01L 2224/81205; H01L 2224/81193; H01L 2224/13023; H01L 2224/13644; H01L 2224/13611; H01L 2224/13647; H01L 2224/13655; H01L 2224/13664; H01L 2224/81801; H01L 2224/1134; H01L 2924/19041; H01L 2924/19042; H01L 2924/19043
See application file for complete search history.

(56) References Cited

U.S. PATENT DOCUMENTS

| | | | |
|---|---|---|---|
| 6,239,366 | B1 | 5/2001 | Hsuan et al. |
| 6,365,500 | B1 | 4/2002 | Chang et al. |
| 6,425,516 | B1 | 7/2002 | Iwatsu et al. |
| 6,555,917 | B1 | 4/2003 | Heo |
| 6,611,434 | B1 | 8/2003 | Lo et al. |
| 6,908,784 | B1 | 6/2005 | Farnworth et al. |
| 7,615,407 | B1 | 11/2009 | Poddar et al. |
| 7,679,177 | B2 | 3/2010 | Jang |
| 9,812,427 | B2 * | 11/2017 | Yu .............. H01L 24/16 |
| 2001/0000157 | A1 | 4/2001 | Oka et al. |
| 2001/0045642 | A1 * | 11/2001 | Farnworth ........... H01L 23/433 |
| | | | 257/E23.09 |
| 2004/0004291 | A1 | 1/2004 | Hirose |
| 2004/0082100 | A1 | 4/2004 | Tsukahara et al. |
| 2004/0127011 | A1 * | 7/2004 | Huang ................ H01L 25/16 |
| | | | 438/613 |
| 2005/0064625 | A1 | 3/2005 | Huang |
| 2005/0242426 | A1 | 11/2005 | Kwon et al. |
| 2006/0099742 | A1 | 5/2006 | Hochstenbach et al. |
| 2007/0267745 | A1 | 11/2007 | Chao et al. |
| 2008/0023805 | A1 | 1/2008 | Howard et al. |
| 2008/0084677 | A1 | 4/2008 | Ho et al. |
| 2009/0091030 | A1 | 4/2009 | Ohnishi |
| 2009/0233436 | A1 * | 9/2009 | Kim .................. H01L 24/81 |
| | | | 438/614 |
| 2010/0147574 | A1 * | 6/2010 | Kaneko ............... H01L 25/16 |
| | | | 29/850 |
| 2010/0319974 | A1 | 12/2010 | Ishizuka |
| 2011/0031634 | A1 | 2/2011 | Pagaila |
| 2011/0187005 | A1 | 8/2011 | Pagaila et al. |
| 2012/0013017 | A1 | 1/2012 | Rassel et al. |
| 2012/0068302 | A1 | 3/2012 | Beierke et al. |
| 2012/0074587 | A1 | 3/2012 | Koo et al. |
| 2012/0322202 | A1 * | 12/2012 | Nishimura ........... H01L 21/568 |
| | | | 438/107 |
| 2013/0134588 | A1 | 5/2013 | Yu et al. |
| 2013/0234344 | A1 * | 9/2013 | Juskey ................ H01L 24/83 |
| | | | 257/778 |
| 2014/0035158 | A1 | 2/2014 | Chang et al. |
| 2014/0183611 | A1 | 7/2014 | Chang et al. |
| 2014/0231977 | A1 | 8/2014 | Kalandar et al. |
| 2015/0091187 | A1 | 4/2015 | Reber et al. |
| 2016/0307876 | A1 | 10/2016 | Yu et al. |
| 2017/0025391 | A1 | 1/2017 | Yu et al. |

FOREIGN PATENT DOCUMENTS

| | | |
|---|---|---|
| CN | 101322233 A | 12/2008 |
| CN | 101894764 A | 11/2010 |
| CN | 104157617 A | 11/2014 |
| JP | H08125112 A | 5/1996 |
| JP | H11121522 A | 4/1999 |
| JP | 2004207589 A | 7/2004 |
| JP | 2005317975 A | 11/2005 |
| JP | 2009094249 A | 4/2009 |
| KR | 20050105361 A | 11/2005 |
| KR | 20130061039 A | 6/2013 |
| TW | 200411886 A | 7/2004 |
| WO | 2004057668 A2 | 7/2004 |
| WO | 2007061216 A1 | 5/2007 |
| WO | 2008105979 A1 | 9/2008 |

* cited by examiner

CHIP INTEGRATION MODULE, CHIP PACKAGE STRUCTURE, AND CHIP INTEGRATION METHOD

CROSS-REFERENCE TO RELATED APPLICATION

This application is a continuation of U.S. patent application Ser. No. 14/810,043, filed on Jul. 27, 2015, which claims priority to Chinese Patent Application No. 201410366385.3, filed on Jul. 29, 2014. All of the aforementioned patent applications are hereby incorporated by reference in their entireties.

TECHNICAL FIELD

The present invention relates to the field of chip manufacturing, and in particular, to a chip integration module, a chip package structure, and a chip integration method.

BACKGROUND

Cost, sizes, and electrical characteristics play very important roles in electronic products, and chips (packaged dies), peripheral devices, and printed circuit boards (PCBs) are cores of electronic products. The cost and size of an electronic product greatly depends on the size of a printed circuit board. Additionally, electrical characteristics depend on the length of a wire connecting a chip and a peripheral device and the distance between a filter circuit and a power supply ground, and a device having a smaller physical size has better electrical characteristics. Many of peripheral devices are passive devices such as resistors, inductors, and capacitors. If a die can be directly integrated with these passive devices at a low cost, and the die integrated with the passive devices can then be connected to a printed circuit board through packaging, performance of an electronic product can be improved in terms of cost, size, electrical characteristics, and so on.

A method for integrating a passive device with a die in the prior art is: An under bump metallization (UBM) layer is disposed on a die, a solderable bump is formed on the under bump metallization layer through printing or electroplating, and integration of the die with a passive device is then implemented. In this method, a UBM layer needs to be formed additionally, which results in an additional cost. The prior art further provides a method for integrating a passive device with a die, in which a passive device is directly bonded to a die by using an electrically conductive adhesive. However, during process implementation of this method, residues of adhesive impurities occur easily, which affects a yield of semiconductor packaging. In addition, compared with metal, a conductive adhesive has poor conductivity, which affects electrical characteristics of integrated passive devices.

SUMMARY

An chip integration module, a chip package structure, and a chip integration method are provided, so that integration becomes easy and costs are low.

According to a first aspect, a chip integration module is provided, including a die, a passive device, and a connecting piece, where the die is provided with a die bonding portion, the passive device is provided with a passive device bonding portion, the die bonding portion of the die and the passive device bonding portion of the passive device are disposed opposite to each other, and the connecting piece is disposed between the die bonding portion and the passive device bonding portion and is connected to the die bonding portion and the passive device bonding portion.

In a first possible implementation manner of the first aspect, the die bonding portion of the die and the passive device bonding portion of the passive device are made of metal.

With reference to the first possible implementation manner of the first aspect, in a second possible implementation manner of the first aspect, the connecting piece is made of any one of gold, silver, copper, titanium, nickel, and aluminum, or an alloy of any two or more of the foregoing metal.

With reference to the second possible implementation manner of the first aspect, in a third possible implementation manner of the first aspect, the connecting piece is connected to the die bonding portion and the passive device bonding portion by means of ultrasonic welding or thermocompression bonding.

With reference to the first aspect and the first to third possible implementation manners of the first aspect, in a fourth possible implementation manner of the first aspect, an integrated passive device or a discrete passive device is used as the passive device.

With reference to the first aspect and the first to third possible implementation manners of the first aspect, in a fifth possible implementation manner of the first aspect, the connecting piece includes a first connecting piece and a second connecting piece, the first connecting piece is connected to the die bonding portion of the die, the second connecting piece is connected to the passive device bonding portion of the passive device, and the first connecting piece and the second connecting piece are connected to each other.

With reference to the first aspect and the first to third possible implementation manners of the first aspect, in a sixth possible implementation manner of the first aspect, the die is provided with a die surface, the die bonding portion is provided with a die bonding surface, and the die bonding surface is concave or convex with respect to or flush with the die surface.

With reference to the first aspect and the first to third possible implementation manners of the first aspect, in a seventh possible implementation manner of the first aspect, the passive device is provided with a passive device surface, the passive device bonding portion is provided with a passive device bonding surface, and the passive device bonding surface is concave or convex with respect to or flush with the passive device surface.

With reference to the first aspect and the first to seventh possible implementation manners of the first aspect, in an eighth possible implementation manner of the first aspect, the die bonding portion is formed on the die by means of sputtering or chemical vapor deposition.

With reference to the first aspect and the first to seventh possible implementation manners of the first aspect, in a ninth possible implementation manner of the first aspect, the passive device bonding portion is formed on the passive device by means of electroplating, sputtering, or chemical vapor deposition.

With reference to the first aspect and the first to seventh possible implementation manners of the first aspect, in a tenth possible implementation manner of the first aspect, a protective layer is provided on the surface of the connecting piece, and the protective layer at least covers a part of the surface of the connecting piece.

With reference to the tenth possible implementation manner of the first aspect, in an eleventh possible implementation manner of the first aspect, the protective layer is made of any one of gold, tin, copper, nickel, and palladium, or an alloy of any two or more of the foregoing metal.

With reference to the eleventh possible implementation manner of the first aspect, in a twelfth possible implementation manner of the first aspect, the protective layer has an organic solderability preservative.

With reference to the first aspect and the first to twelfth possible implementation manners of the first aspect, in a thirteenth possible implementation manner of the first aspect, a gap is provided between the die and the passive device, and the gap between the die and the passive device is filled with a filling material.

With reference to the thirteenth possible implementation manner of the first aspect, in a fourteenth possible implementation manner of the first aspect, a filling adhesive is used as the filling material.

According to a second aspect, a chip package structure is provided, including a base and the chip integration module according to any one of the first aspect and the first to fourteenth possible implementation manners of the first aspect, where the chip integration module is disposed on the base.

According to a third aspect, a chip integration method is provided, including the following steps:

providing a die and a passive device, where the die is provided with a die bonding portion, and the passive device is provided with a passive device bonding portion; and disposing a connecting piece, where the connecting piece is connected to the die bonding portion and the passive device bonding portion, and the connecting piece is located between the die bonding portion and the passive device bonding portion.

With reference to the third aspect, in a first possible implementation manner of the third aspect,
 the disposing a connecting piece further includes the following steps:
 forming the connecting piece on one of the die bonding portion and the passive device bonding portion; and
 connecting the connecting piece to the other of the die bonding portion and the passive device bonding portion.

With reference to the first possible implementation manner of the third aspect, in a second possible implementation manner of the third aspect,
 during the disposing of the connecting piece, the connecting piece is formed on one of the die bonding portion and the passive device bonding portion by means of wire bonding and cutting, and the connecting piece is connected to the other of the die bonding portion and the passive device bonding portion by means of ultrasonic welding or thermocompression bonding.

With reference to the third aspect, in a third possible implementation manner of the third aspect:
 the connecting piece includes a first connecting piece and a second connecting piece, and the disposing a connecting piece further includes the following steps:
 forming the first connecting piece of the connecting piece on the die bonding portion of the die;
 forming the second connecting piece of the connecting piece on the passive device bonding portion of the passive device; and
 connecting the first connecting piece to the second connecting piece.

In the chip integration module, the chip package structure, and the chip integration method of the present invention, no UBM layer needs to be formed in an additional process step, and therefore, integration becomes easy and costs are low. In the chip integration module and the chip package structure of the present invention, a die bonding portion of a die and a passive device bonding portion of a passive device are disposed opposite to each other and are connected through a connecting piece. In this way, a path connecting the die to the passive device of the chip integration module and the chip package structure becomes shorter, and overall sizes of the chip integration module and the chip package structure are reduced.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
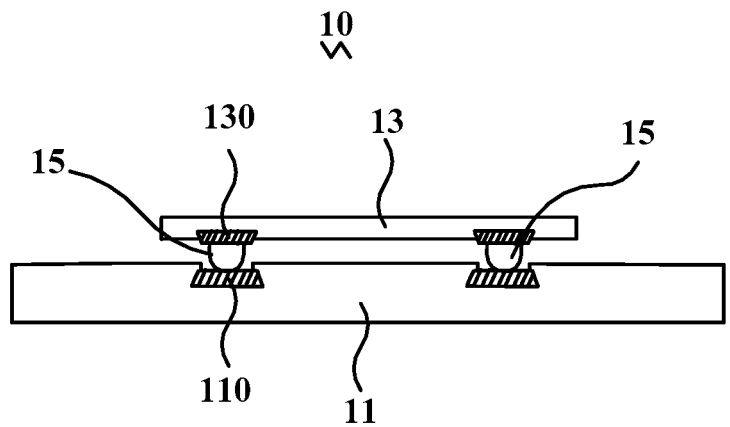
FIG. 1 is a schematic structural diagram of a chip integration module in an assembled state according to a first exemplary implementation manner of the present invention.
Figure 2:
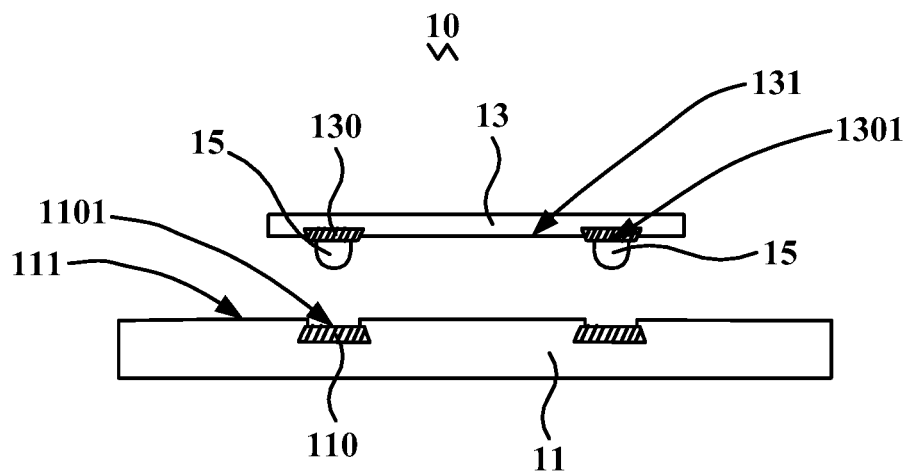
FIG. 2 is a schematic structural diagram of a chip integration module in a disassembled state according to the first exemplary implementation manner of the present invention.

Referring to FIG. 1 and FIG. 2, a first exemplary implementation manner of the present invention provides a chip integration module 10, including a die 11, a passive device 13, and a connecting piece 15, where the die 11 and the passive device 13 are connected to each other through the connecting piece 15.

In this embodiment, a logical circuit, a storage device, or another type of circuit may be used as the die 11, and a semiconductor component such as a diode, a transistor, or a capacitor may further be disposed on the die 11. The die 11 is provided with at least one die bonding portion 110. As shown in the figures, in this embodiment, two die bonding portions 110 are provided, and the die bonding portions 110 are formed on the die 11 and are exposed from the die 11.

The die bonding portion 110 is made of sheet-like metal, and preferably, the die bonding portion 110 is made of aluminum (Al), copper (Cu), or an alloy of aluminum and copper. It may be understood that the die bonding portion 110 may be directly formed on the die 11, and the die bonding portion 110 may also be connected to the original die 11 in various manners on the basis of the original die 11, so as to form the die 11 provided with the die bonding portion 110. For example, the die bonding portion 110 may be formed on the surface of the die 11 by means of sputtering, chemical vapor deposition (CVD), or the like, and a specific forming manner of the die bonding portion 110 is not described herein in detail.

An integrated passive device (IPD) or a discrete passive device, for example, a filter or various types of capacitors such as a normal capacitor or a multi-layer ceramic capacitor (MLCC) may be used as the passive device 13. The passive device 13 is provided with a passive device bonding portion 130 that corresponds to each die bonding portion 110 of the die 11. As shown in FIG. 2, in this embodiment, two passive device bonding portions 130 are provided likewise. The passive device bonding portions 130 are formed on the passive device and are exposed from the passive device 13. The passive device bonding portion 130 is made of sheet-like metal; and preferably, the passive device bonding portion 130 is made of aluminum (Al), copper (Cu), or an alloy of aluminum and copper. Similarly, the passive device bonding portion 130 may be formed on the surface of the passive device 13 by means of electroplating, sputtering, CVD, or the like, and a specific forming manner of the passive device bonding portion 130 is not described herein in detail.

The connecting piece 15 is block-shaped. The die bonding portion 110 of the die 11 and the passive device bonding portion 130 of the passive device 13 are disposed opposite. The connecting piece 15 is connected to the die bonding portion 110 of the die 11 and the passive device bonding portion 130 of the passive device 13, and the connecting piece 15 is located between the die bonding portion 110 of the die 11 and the passive device bonding portion of the passive device 13 to connect the die 11 to the passive device 13. In this embodiment, the connecting piece 15 may be made of any one of gold (Au), silver (Ag), copper (Cu), titanium (Ti), nickel (Ni), and aluminum (Al), or an alloy formed of any two or more of the metal. It may be understood that solder may further be added to constituents of the connecting piece 15, so that the connecting piece 15 is easily connected to the die 11 and the passive device 13 by means of welding.

Further, in this embodiment, as shown in FIG. 2, the die 11 is provided with a die surface 111, the die bonding portion 110 is provided with a die bonding surface 1101, and the die bonding surface 1101 is concave or convex with respect to the die surface 111, or flush with the die surface 111.

Similarly, the passive device 13 is provided with a passive device surface 131, the passive device bonding portion 130 is provided with a passive device bonding surface 1301, and the passive device bonding surface 1301 is concave or convex with respect to the passive device surface 131, or flush with the passive device surface 131.

It may be understood that the die bonding portion 110 and the passive device bonding portion 130 may be disposed or formed on the die 11 and the passive device 13 in any applicable manner, as long as it is ensured that the die bonding portion 110 and the passive device bonding portion 130 can be exposed from the die 11 or the passive device 13, so that the die bonding portion 110 and the passive device bonding portion 130 are connected to the connecting piece 15.

In an assembled state, the die bonding portion 110 of the die 11 and the passive device bonding portion 130 of the passive device 13 are disposed opposite to each other, and are connected to each other through the connecting piece 15, so that the passive device 13 is connected to the die 11 in an integrated manner. It may be understood that disposition positions and quantities of the die bonding portions 110 of the die 11, the passive device bonding portions 130 of the passive device 13, and the correspondingly disposed connecting pieces 15 may be set according to use and connection requirements.

Figure 3:
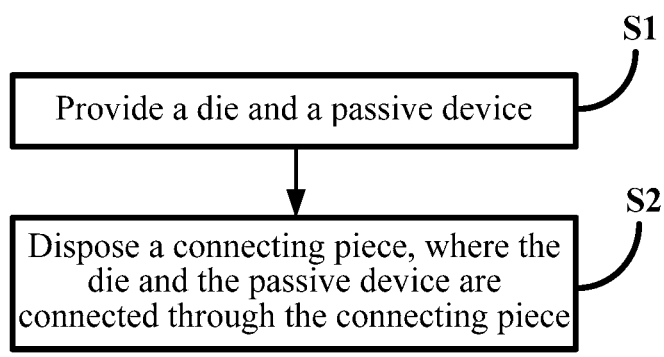
FIG. 3 is a flowchart of a chip integration method of a chip integration module according to the first exemplary implementation manner of the present invention.

As shown in FIG. 3, a chip integration method of the chip integration module 10 in this embodiment includes the following steps:

Step S1: Provide the die 11 and the passive device 13, where the die 11 is provided with the die bonding portion, and the passive device 13 is provided with the passive device bonding portion 130.

Step S2: Dispose a connecting piece 15, where the connecting piece 15 is connected to the die bonding portion 110 and the passive device bonding portion 130, and the connecting piece 15 is located between the die bonding portion 110 and the passive device bonding portion 130, so that the die 11 and the passive device 13 are connected to each other.

Step S2 further includes the following steps:

Step S21: Form the connecting piece 15 on one of the die bonding portion 110 and the passive device bonding portion 130. In this embodiment, the connecting piece 15 may be formed on the die bonding portion 110 of the die 11. Specifically, in step S21, the weldable connecting piece 15 may be formed on the die bonding portion 110 on the surface of the die 11 by means of wire bonding and cutting.

Figure 4:
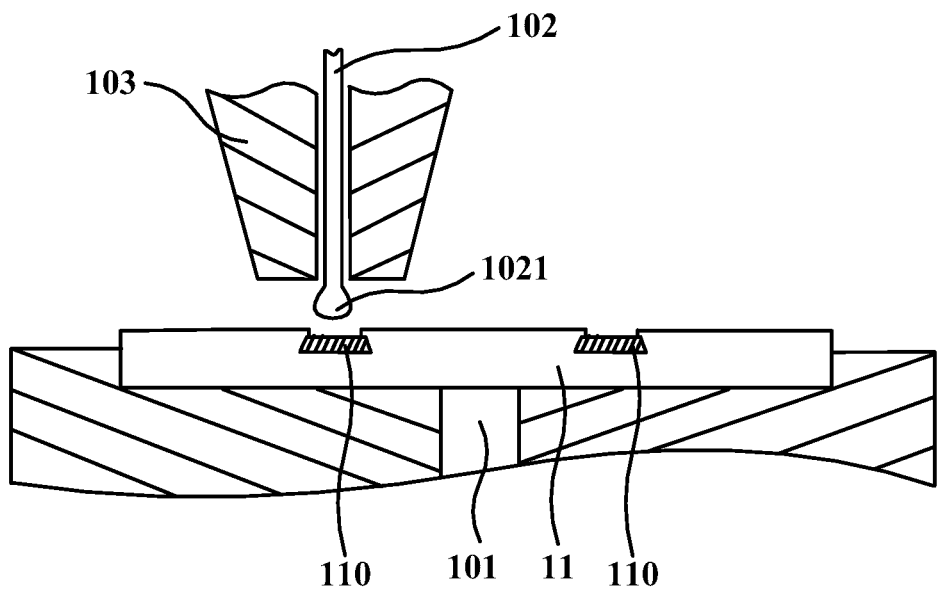
FIG. 4 to FIG. 6 are schematic diagrams of fabrication in a fabrication process of the chip integration method shown in FIG. 3.
Figure 5:
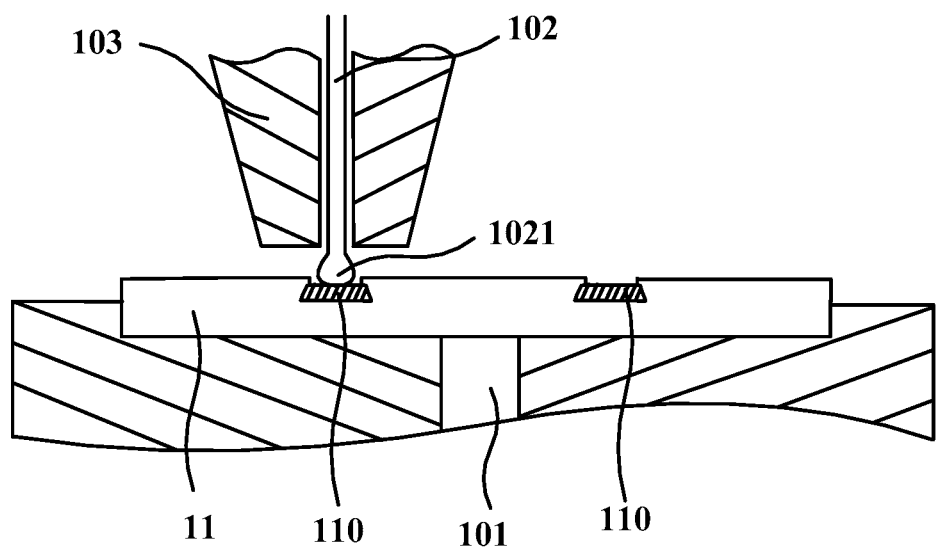

As shown in FIG. 4 and FIG. 5, when the weldable connecting piece 15 is formed on the die bonding portion 110 on the surface of the die 11 by means of wire bonding and cutting, the die 11 is first fixed by using a vacuum nozzle 101 of a wire bonder. A wire 102 is then selected, the wire 102 is threaded through a welding joint 103 of the wire bonder, and a wire ball 1021 is formed at an end of the wire 102 by using the welding joint 103. The welding joint 103 of the wire bonder is moved, so that the wire ball 1021 contacts the die bonding portion 110 on the surface of the die 11. The wire ball 1021 is bonded with the die bonding portion 110 on the surface of the die 11 by using the welding joint 103 of the wire bonder, where the die 11 may be preheated before the wire ball 1021 is bonded. The wire 102 is cut, and the wire ball 1021 stays on the die bonding portion 110 of the die 11 as the connecting piece 15.

It may be understood that in the chip integration method in this embodiment, the connecting piece 15 may also be first formed on the passive device bonding portion 130 of the passive device 13 by means of wire bonding and cutting, and specific steps of forming are similar to the foregoing steps and are not described herein in detail. A material of the wire 102 is consistent with a material of the eventually formed connecting piece 15.

Step S22: Connect the connecting piece 15 to the other of the die bonding portion 110 and the passive device bonding portion 130.

Further, in the chip integration method in this embodiment, the connecting piece 15 connected to the die bonding portion 110 may also be connected to the passive device bonding portion 130 of the passive device 13 by using any applicable method.

Figure 6:
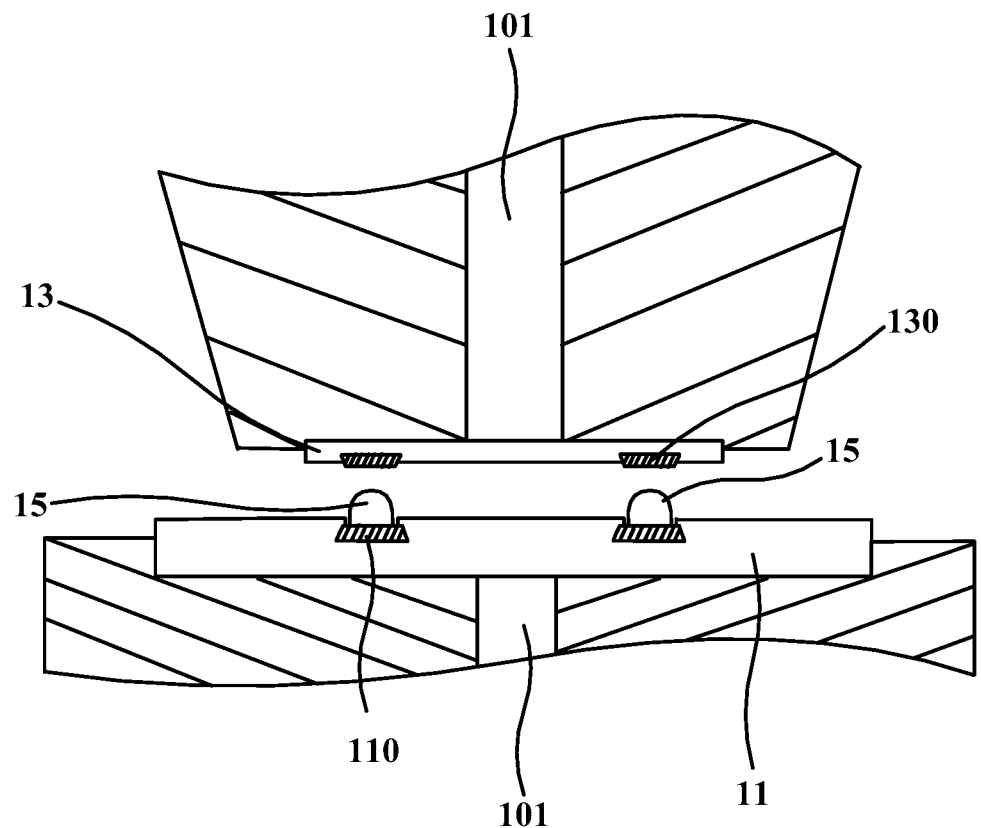

As shown in FIG. 6, specifically, in this embodiment, after the connecting piece 15 is formed on the die bonding portion 110 of the die 11 in step S21, the connecting piece 15 may further be connected to the passive device by means of ultrasonic welding and thermocompression bonding, so as to implement integration of the die 11 and the passive device 13.

Specifically, the passive device 13 is fixed by using the vacuum nozzle 101. The passive device 13 enables the connecting piece 15 connected to the die 11 to contact the passive device bonding portion 130 of the passive device 13, and pressure and ultrasonic friction are applied on the connecting piece 15 by using a welding joint of an ultrasonic welding machine, so that the connecting piece 15 and the passive device 13 are connected to each other by means of thermocompression bonding and ultrasonic welding. It may be understood that in the chip integration method in this embodiment, the connecting piece 15 may also be connected to the die 11 and the passive device 13 by using any other applicable method. It may be understood that in a process of connecting the connecting piece 15 to the die 11 and the passive device 13, the connecting piece 15 may deform to some extent, and the connecting piece 15 may have a shape after a deformation of any form.

Figure 7:
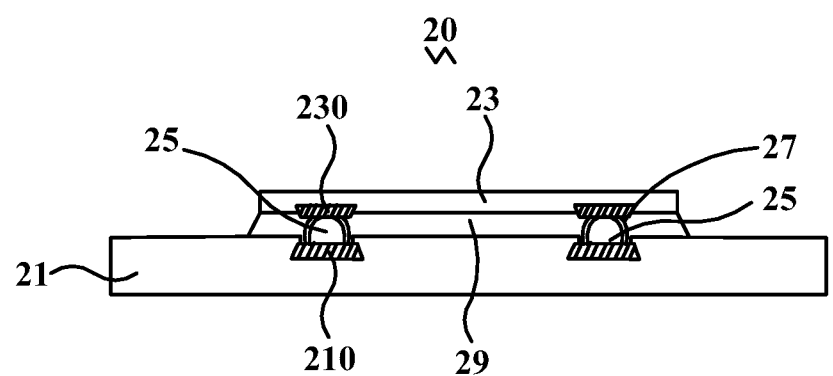
FIG. 7 is a schematic structural diagram of a chip integration module in an assembled state according to a second exemplary implementation manner of the present invention.

FIG. 7 shows a chip integration module 20 of a second exemplary embodiment of the present invention. The chip integration module 20 in this embodiment is approximately the same as the chip integration module 10 in the first exemplary embodiment. The chip integration module 20 includes a die 21, a passive device 23, and a connecting piece 25, where the die 21 is provided with a die bonding portion 210, the passive device 23 is provided with a passive device bonding portion 230, and the die bonding portion 210 of the die 21 and the passive device bonding portion 230 of the passive device 23 are disposed opposite to each other and are connected to each other through the connecting piece 25.

A difference lies in that a protective layer 27 is provided on the surface of the connecting piece 25, and the protective layer 27 at least covers a part of the surface of the connecting piece 25. An organic solderability preservative (OSP) layer 27 may be used as the protective layer 27. The protective layer 27 may further be made of gold (Au), tin (Sn), copper (Cu), nickel (Ni), palladium (Pd), or an alloy thereof. A chip integration method of the chip integration module 20 in this embodiment is approximately the same as that in the first exemplary embodiment, and is not described herein in detail.

In this embodiment, the protective layer 27 may be formed by using a wire having a protective layer, that is, when the connecting piece 25 is formed on the die bonding portion 210 on the surface of the die 21 by means of wire bonding and cutting, a wire with the protective layer 27 is used, and in this way, the formed connecting piece 25 also has the protective layer 27.

Further, a gap is provided between the die 21 and the passive device 23, and the gap between the die 21 and the passive device 23 is filled with a filling material 29, where an underfill or another filling material may be used as the filling material 29.

Figure 8:
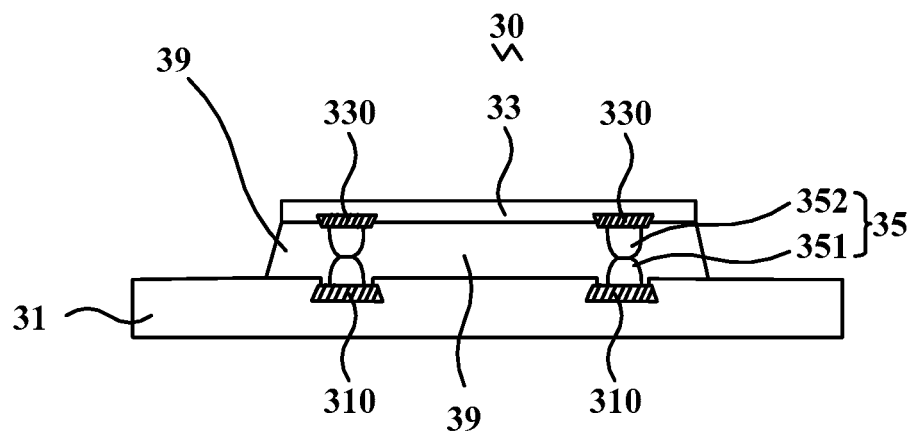
FIG. 8 is a schematic structural diagram of a chip integration module in an assembled state according to a third exemplary implementation manner of the present invention.

FIG. 8 shows a chip integration module 30 of a third exemplary embodiment of the present invention. The chip integration module 30 in this embodiment is approximately the same as the chip integration module 10 in the first exemplary embodiment.

In this embodiment, the chip integration module 30 includes a die 31, a passive device 33, and a connecting piece 35, where the die 31 is provided with a die bonding portion 310, the passive device 33 is provided with a passive device bonding portion 330, and the die bonding portion 310 of the die 31 and the passive device bonding portion 330 of the passive device 33 are disposed opposite to each other and are connected to each other through the connecting piece 35.

A difference lies in that the connecting piece 35 in this embodiment includes a first connecting piece 351 and a second connecting piece 352, where the first connecting piece 351 is connected to the die bonding portion 310 of the die 31, the second connecting piece 352 is connected to the passive device bonding portion 330 of the passive device 33, and the first connecting piece 351 and the second connecting piece 352 are connected to each other, so that the passive device 33 is connected to and is integrated with the die 31.

It may be understood that, same as that for the chip integration module 10 in the first exemplary embodiment, the passive device 33 and the die 31 may be correspondingly disposed with multiple passive device bonding portions 330 and multiple die bonding portions 310, and multiple pairs of first connecting pieces 351 and second connecting pieces 352 that correspond to the multiple passive device bonding portions 330 and the multiple die bonding portions 310 may be disposed on the chip integration module 30. Materials of the first connecting piece 351 and the second connecting piece 352 are the same as the material of the connecting piece 15 in the first exemplary embodiment.

It may be understood that the protective layer 27 in the second exemplary embodiment may also partially cover the first connecting piece 351 and the second connecting piece 352 of the connecting piece 35 in this embodiment. A gap between the die 31 and the passive device 33 may also be filled with a filling material 39.

A chip integration method of the chip integration module 30 in this embodiment is approximately the same as the chip integration method in the first exemplary embodiment, and includes the following steps:

Step S1: Provide the die 31 and the passive device 33, where the die 31 is provided with the die bonding portion 310, and the passive device 33 is provided with the passive device bonding portion 330.

Step S2: Dispose the connecting piece 35, where the die 31 and the passive device 33 are connected to each other through the connecting piece 35.

A difference lies in that in this embodiment, step S2 further includes the following steps:

Step S21': Form the first connecting piece 351 of the connecting piece 35 on the die bonding portion 310 of the die 31.

Step S22': Form the second connecting piece 352 of the connecting piece 35 on the passive device bonding portion 330 of the passive device 33.

Step S23': Connect the first connecting piece 351 to the second connecting piece 352. In this step, the die 31 and the passive device 33 are connected to each other through the first connecting piece 351 and the second connecting piece 352.

In this embodiment, manners of connecting the connecting piece 35 to the die 31 and the passive device 33 are consistent.

Figure 9:
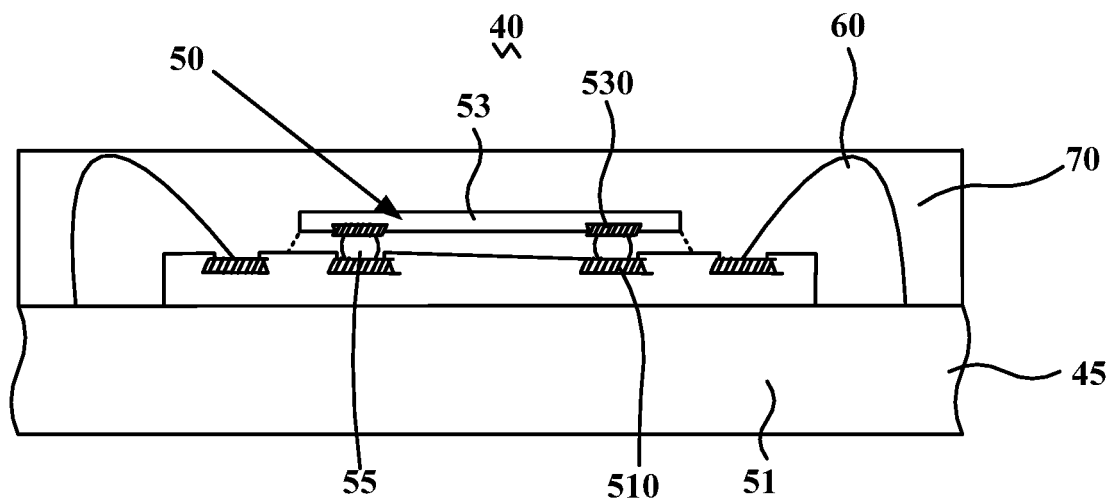
FIG. 9 is a schematic structural diagram of a chip package structure according to a fourth exemplary implementation manner of the present invention.

FIG. 9 shows a chip package structure 40 according to a fourth preferred embodiment of the present invention. The chip package structure includes a base 45 and a chip integration module 50 disposed on the base. The chip integration module 50 has a structure that is approximately the same as the chip integration module described in the first exemplary embodiment or the second exemplary embodiment, and includes a die 51, a passive device 53, and a connecting piece 55, where the die 51 is provided with a die bonding portion 510, the passive device 53 is provided with a passive device bonding portion 530, and the die bonding portion 510 of the die 51 and the passive device bonding portion 530 of the passive device 53 are disposed opposite to each other and are connected to each other through the connecting piece 55.

A connection wire 60 is further provided on the chip package structure 40, the die 51 of the chip integration module 50 is further provided with a connection wire bonding portion, and the connection wire is connected between the connection wire bonding portion and the base 45 to connect the die 51 to the base 45 by means of wire bonding.

In this embodiment, a lead-frame, a substrate, or a semiconductor material such as a semiconductor wafer may be used as the base 45. A moulding compound 70 for protecting the chip integration module 50 may further be formed on the base 45. It may be understood that the chip integration module 50 may be disposed on the base by using any applicable prior art. For example, a connection wire may be canceled from the chip package structure 40, and the die 51 of the chip integration module 50 is connected to the base 45 by means of flip-chip bonding.

In the chip integration module, the chip package structure, and the chip integration method of the present invention, an additional process step of forming a UBM layer is not required, so that costs are reduced. A die bonding portion of a die and a passive device bonding portion of a passive device are disposed opposite to each other and are connected through a connecting piece. In this way, a path connecting the die to the passive device of the chip integration module and the chip package structure becomes shorter, and overall sizes of the chip integration module and the chip package structure are reduced. Moreover, compared with a long connecting path, a short connecting path facilitates implementation of desirable performance of a passive device. For example, when the passive device is a capacitor, noise filtering can be more effectively performed in a short connecting path, or when the passive device is a filter, bandwidth of the filter is more easily controlled because a path connecting a die to a passive device becomes shorter and a channel parasitic effect becomes less strong.

The contents disclosed above are merely exemplary embodiments of the present invention, but not intended to limit the scope of present invention. A person of ordinary skill in the art can understand all or a part of the procedures for implementing the foregoing embodiments, and any equivalent variation made by them according to the claims of the present invention shall still fall within the scope of the present invention.

What is claimed is:

1. A chip integration module, comprising a die, a passive device, and a connecting piece, wherein:
the die is provided with a die surface and a die bonding portion, the die bonding portion being provided with a die bonding surface, the die bonding surface being convex with respect to the die surface,
the passive device is provided with a passive device bonding portion and a passive device surface, the passive device bonding surface being concave with respect to the passive device surface such that at least a portion of the passive device bonding surface is within the passive device surface, wherein the die bonding portion of the die and the passive device bonding portion of the passive device are disposed opposite to each other, and
the connecting piece is disposed between the die bonding portion and the passive device bonding portion, and is connected to the die bonding portion and the passive device bonding portion,
wherein the connecting piece comprises a first connecting element and a second connecting element, the first connecting element is connected to the die bonding portion of the die, the second connecting element is connected to the passive device bonding portion of the passive device, and the first connecting element and the second connecting element are connected to each other,
wherein a protective layer partially cover the first connecting element and the second connecting element;
wherein a gap is provided between the die and the passive device, and the gap between the die and the passive device is filled with a filling material.

2. The chip integration module according to claim 1, wherein the die bonding portion of the die and the passive device bonding portion of the passive device are made of a metal.

3. The chip integration module according to claim 2, wherein the connecting piece is made of one or more of gold, silver, copper, titanium, nickel, and aluminum, and any alloys thereof.

4. The chip integration module according to claim 3, wherein the connecting piece is connected to the die bonding portion and the passive device bonding portion by ultrasonic welding or thermocompression bonding.

5. The chip integration module according to claim 1, wherein an integrated passive device or a discrete passive device is used as the passive device.

6. The chip integration module according to claim 1, wherein the die bonding portion is formed on the die by sputtering or chemical vapor deposition.

7. The chip integration module according to claim 1, wherein the passive device bonding portion is formed on the passive device by electroplating, sputtering, or chemical vapor deposition.

8. The chip integration module according to claim 1, wherein the protective layer is made of one or more of gold, tin, copper, nickel, and palladium, and any alloys thereof.

9. The chip integration module according to claim 8, wherein the protective layer has an organic solderability preservative.

10. The chip integration module according to claim 1, wherein the filling material comprises a filling adhesive.

11. A chip package structure, comprising a base, and a chip integration module according to claim 1.

* * * * *